(12) United States Patent
le Neal et al.

(10) Patent No.: US 10,144,636 B2
(45) Date of Patent: Dec. 4, 2018

(54) METHOD OF MANUFACTURING A SENSOR

(71) Applicant: MEAS Switzerland S.à.r.l., Bevaix (CH)

(72) Inventors: Jean-Francois le Neal, Neuchatel (CH); Predrag Drljaca, Neuchatel (CH)

(73) Assignee: MEAS Switzerland S.a.r.l., Bevaix (CH)

( * ) Notice: Subject to any disclaimer, the term of this patent is extended or adjusted under 35 U.S.C. 154(b) by 0 days.

(21) Appl. No.: 15/275,662

(22) Filed: Sep. 26, 2016

(65) Prior Publication Data
US 2018/0086626 A1 Mar. 29, 2018

(51) Int. Cl.
B81B 7/00 (2006.01)
B81C 1/00 (2006.01)
G01L 9/00 (2006.01)
B81C 3/00 (2006.01)

(52) U.S. Cl.
CPC .......... *B81B 7/007* (2013.01); *B81C 1/00301* (2013.01); *B81C 1/00309* (2013.01); *B81C 3/005* (2013.01); *G01L 9/0054* (2013.01); *B81B 2201/0264* (2013.01); *B81B 2203/0127* (2013.01); *B81B 2207/012* (2013.01); *B81B 2207/07* (2013.01); *B81C 2203/031* (2013.01); *B81C 2203/0792* (2013.01)

(58) Field of Classification Search
CPC ..... H01L 2224/48091; H01L 2924/181; H01L 2224/48227; H01L 2224/49109; H01L 2224/73265; B81B 2201/0235; B81B 2201/0242; B81B 2207/092; B81B 2207/097; B81B 7/007; B81B 7/02
USPC ........................................................ 257/419
See application file for complete search history.

(56) References Cited

U.S. PATENT DOCUMENTS

| | | | |
|---|---|---|---|
| 2012/0247227 A1* | 10/2012 | Crivelli | G01L 19/086 73/862.381 |
| 2013/0285259 A1 | 10/2013 | Han | |
| 2015/0266720 A1* | 9/2015 | Furuhata | B81B 7/0041 257/415 |

FOREIGN PATENT DOCUMENTS

EP 2362203 A2 8/2011

OTHER PUBLICATIONS

International Search Report and Written Opinion of the International Searching Authority dated Dec. 6, 2017 for related PCT Application No. PCT/EP2017/074229.

* cited by examiner

Primary Examiner — Caleen Sullivan
(74) Attorney, Agent, or Firm — Howard IP Law Group PC

(57) ABSTRACT

A sensor for measuring, for example, the pressure of a gas or other fluid comprising a glass substrate having an aperture defined therethrough. A semiconductor die defining a diaphragm is anodically bonded to the glass substrate such that the diaphragm is exposed via the aperture. At least one electrically conductive element in electrical communication with the semiconductor die is arranged on a surface of the glass substrate.

20 Claims, 6 Drawing Sheets

METHOD OF MANUFACTURING A SENSOR

FIELD OF THE INVENTION

The application relates to sensors. More particularly, the application relates to sensors for detecting, for example, pressures of gases and other fluids.

BACKGROUND OF THE INVENTION

A pressure sensor (or transducer) converts a fluid or gas pressure to an electrical signal as a function of the pressure imposed. These sensors are generally embodied in pressure sensor packages, and include a pressure-sensing device such as a silicon die. Such devices are typically manufactured using micro-machined or Micro-Electro-Mechanical System (MEMS) based techniques. One common technique for manufacturing a pressure sensor package is to attach a MEMS device onto a substrate, such as a ceramic or printed circuit board (PCB) substrate. Enabling circuit components such as application-specific integrated circuits (ASICs), as well as conductive bonding pads and/or electrical traces, may be mounted to or formed on the substrate for electrically connecting to the MEMS device to perform desired functions (e.g. analog to digital conversion and/or amplification).

Silicon and/or other semiconductor materials used to form the pressure sensing device, however, have coefficients of thermal expansions (CTEs) that are significantly different than those of the ceramic or PCB materials used to form the substrates. This CTE mismatch can lead to inaccurate pressure measurements due to strain placed on the sensing device resulting from environmental temperature changes. Moreover, the sensing devices are typically attached to the substrate via an adhesive. These adhesives may negatively affect sensor performance. When used in an environment which includes conductive or corrosive fluids (e.g. corrosive gasses), the sensor must be isolated from the harsh media in order to protect both the sensor as well as the electronic or electrical components attached thereto. For example, in applications which expose the sensor to harsh or corrosive media or the surrounding environment (e.g., in a fuel pressure sensing application), the adhesive can break down and ultimately fail.

Alternative pressure sensor systems and methods are desired.

SUMMARY

In one embodiment of the present disclosure a sensor for measuring a force is provided. The sensor includes a glass substrate having an aperture defined therethrough. A semiconductor die defining a sensing diaphragm is attached to the glass substrate such that the diaphragm is exposed to the aperture. At least one electrically conductive element in electrical communication with the semiconductor die may be arranged or formed on a surface of the glass substrate for enabling operation of the sensor.

In another embodiment of the present disclosure, a method of forming a sensor is provided. The method includes the steps of forming an aperture in a glass substrate and attaching a sensing die to a surface of the glass substrate such that a diaphragm of the sensing die is aligned with the aperture. A conductive element may be arranged or otherwise formed on the glass substrate and electrically connected to the sensing die for enabling the operation of the sensor.

DETAILED DESCRIPTION

Figure 1:
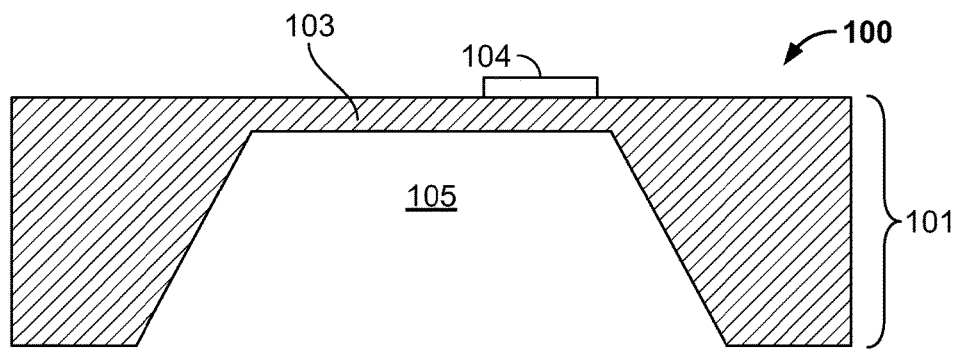
FIG. 1 is a cross-sectional view of a pressure sensor die useful for describing embodiments of the present disclosure.

It is to be understood that the figures and descriptions of the present invention have been simplified to illustrate elements that are relevant for a clear understanding of the present invention, while eliminating, for purposes of clarity, many other elements found in typical sensing systems, such as MEMS-based sensors. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

FIG. 1 is a cross-sectional view of a MEMS-type pressure sensing die or device 100 useful for describing embodiments of the present disclosure. Die 100 is formed from, for example, a semiconductor material such as a silicon wafer to produce a structure 101. Semiconductor structure 101 is then selectively thinned to define a cavity 105 and a corresponding diaphragm 103. Semiconductor structure 101 may be thinned by any suitable means (e.g. using anisotropic etching or dry etching) as is known in the art. One or more piezo-resistive elements 104 are placed or formed on a surface of diaphragm 103. Each piezo-resistive element 104 is configured to exhibit a resistance that is proportional to the strain placed on the thinned semiconductor material defining diaphragm 103. Deflection of diaphragm 103 in response to a pressure within cavity 105 applies strain on piezo-resistive elements 104.

Figure 2:
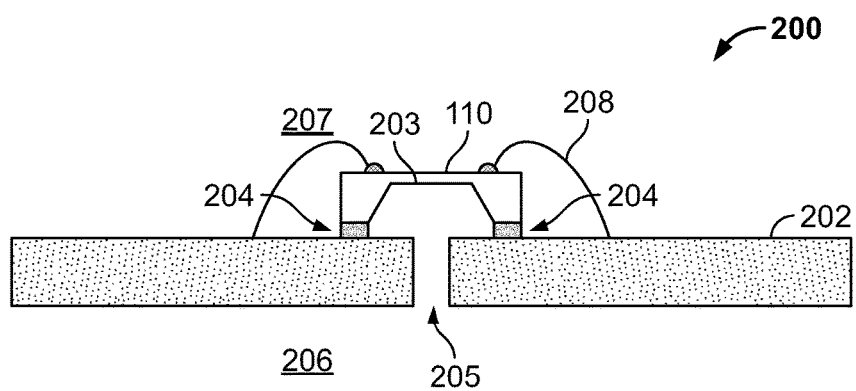
FIG. 2 is a cross-sectional view of a pressure sensor package according to the prior art.

FIG. 2 is a simplified cross-sectional view of a MEMS gage or absolute pressure sensor package 200 of the prior art utilizing a pressure sensing die similar to that set forth above with respect to FIG. 1. As illustrated, pressure sensing die 110 is mounted to a ceramic or PCB substrate 202 via an adhesive material 204. An opening or aperture 205 is defined through substrate 202 for providing communication between a fluid or gas medium to be measured 206 and an underside of a diaphragm 203 of pressure sensing die 110. As shown, in addition to securing pressure sensing die 110 to substrate 202, adhesive material 204 forms a seal for isolating fluid or gas medium 206 from an external environment 207, as well as from electrical components and connections of package 200. In other embodiments, pressure sensing die 110 may be mounted to a support structure or constraint (not shown) which is in turn bonded or otherwise adhered to substrate 202 for isolating die 110 from sources of strain, such as the thermal expansion of substrate 202. Electrical connections between pressure sensing die 110 and electrical features (e.g. bond pads, metalized conductors, or electrical components such as one or more ASICs) may be made via one or more bond wires 208. These features may be mounted to substrate 202, or arranged remotely therefrom.

In operation, when a force is exerted on pressure sensing die 110, an electrical signal supplied through piezo-resistive elements (e.g. element(s) 104 of FIG. 1), by way of example only, varies in proportion to the amount of deflection of diaphragm 203. Thus, a resulting output electrical signal is representative of the force applied to diaphragm 203 of pressure sensing die 110. An output electrical signal can be provided (e.g. via bond wires 208) to other system circuitry, such as control or calibration circuits for generating pressure data from the output electrical signal. This pressure data may be stored, by way of non-limiting example, in an electronic memory. Pressure data may also be provided to other processing components for purposes such as display, control, parameter sensing (e.g. altitude, flow, depth), calibration, diagnostic purposes and/or other applications, by way of example only.

As described above, certain applications utilize a fluid or medium 206 which is harsh or corrosive, such as fuel or oil. The adhesive material 204 used to secure pressure sensing die 110 to substrate 202 may be exposed to this corrosive environment and may corrode over time. This corrosion can lead to a partial or complete failure of the joint or seal, resulting in the leakage of fluid 206 into environment 207 which can damage components of the sensor and/or otherwise negatively affect its performance. Embodiments of the present disclosure remedy these shortcomings by providing a pressure sensor package that eliminates the risk of these types of failures.

Figure 3:
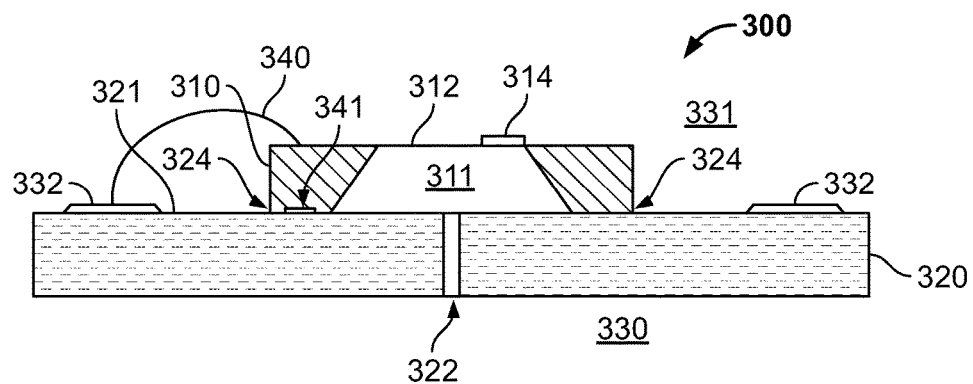
FIG. 3 is a cross-sectional view of a pressure sensor package according to an embodiment of the present disclosure.

Referring generally to FIG. 3, a simplified pressure sensor assembly or package 300 according to an embodiment of the present disclosure is provided. Pressure sensor package 300 includes a pressure sensing die 310, such as a semiconductor (e.g. silicon) die. As set forth above, die 310 may be selectively thinned to form a cavity 311 and a corresponding diaphragm 312 having piezo-resistive or piezo-sensitive elements 314, by way of example only, arranged or formed thereon for detecting diaphragm strain in response to a pressurized fluid or gas 330 acting thereon. A glass substrate 320 is provided and includes an aperture 322 formed therethrough (e.g. by a drilling operation). Glass substrate 320 may comprise borosilicate glass, or other materials bondable (e.g. anodically bondable) to silicon. Die 310 is arranged directly on glass substrate 320 such that diaphragm 312 and cavity 311 are in communication with aperture 322. In this way, an underside of diaphragm 312 is exposed to fluid or medium 330 via aperture 322 for detecting a pressure applied thereto.

Glass substrate 320 may be selectively metalized on a first or top surface 321 thereof for forming electrically conductive features for establishing operational connections with die 310. This metallization can be realized by screen printing, electrodeposition, sputtering or evaporation, by way of non-limiting example only. By way of further example, one or more bond or connection pads 332 may be formed on top surface 321 of glass substrate 320. Bond wires 340 may also be provided for forming electrical connections between die 310 and bond pads 332. In other embodiments, such as those manufactured using "flip chip" techniques, electrical connections between die 310 and conductive features on glass substrate 320 may be achieved via conductive pads and/or solder bumps 341 formed on top side 321 of glass substrate 320 and/or a bottom-facing side of die 310. Other electrical components (active and/or passive), such as one or more ASICs (not shown), may also be arranged on glass substrate 320 for providing additional functionality to the package. This signal conditioning circuitry may provide for, for example, amplification, analog-to-digital conversion, offset compensation circuitry, and/or other suitable signal conditioning electronics. Electrical connection to an overall system can be made by surface mounted wires from electrical traces or vias present on the substrate. In other embodiments of the present disclosure, no electrical features or components are formed or arranged on glass substrate 320.

According to embodiments of the present disclosure, die 310 may be anodically bonded or electrostatically sealed to glass substrate 320 at a junction 324 extending around a perimeter of die 310. This process results in the formation of a strong, hermetic seal between die 310 and glass substrate 320, isolating fluid or medium 330 and cavity 311 from an external environment 331. It should be understood that this bond is unaffected by any corrosive properties of fluid or medium 330 and without the limitations of adhesives. Moreover, as the CTE of the silicon or other semiconductor material used to form die 310 more closely matches the CTE of glass substrate 320, pressure sensor package 300 offers improved performance and reliability compared to prior art sensors having a more significant CTE mismatch between a sensing die and a substrate material thereof.

Figure 4:
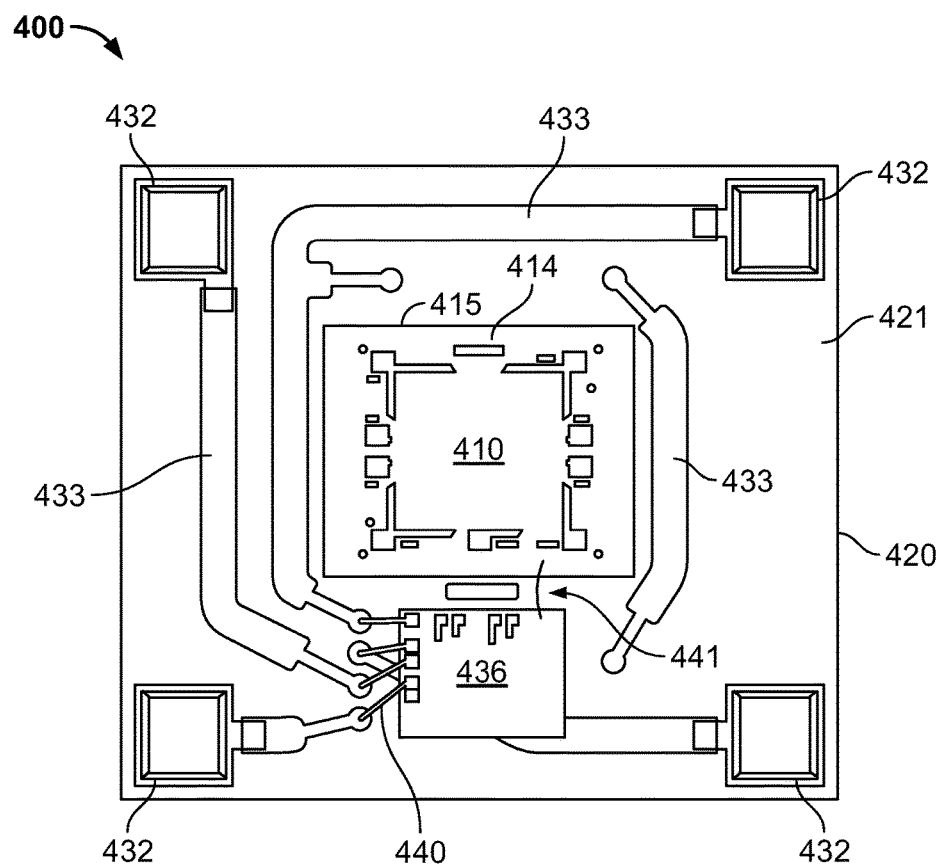
FIG. 4 is a top view of a pressure sensor package according to another embodiment of the present disclosure.

FIG. 4 illustrates a top view of a simplified pressure sensor package 400 according to another embodiment of the present disclosure. Package 400 includes a pressure sensing die 410 defining a pressure-sensing diaphragm (not shown). Die 410 comprises, by way of example, a plurality of piezo-resistive elements 414 arranged or formed thereon for detecting diaphragm strain. Die 410 is mounted on a top surface 421 of a glass substrate 420. As described above with respect to FIG. 3, die 410 may be mounted over an aperture (not shown) formed through glass substrate 420 such that the pressure sensing diaphragm is exposed to a fluid (e.g. gas) to be measured via the aperture.

Electrically conductive bond or connection pads 432 may be arranged or formed on top surface 421 of glass substrate 420 for establishing electrical connections between package 400 and external components. An ASIC 436 is disposed on top surface 421 of glass substrate 420 and attached via an adhesive, for example. Electrical connections between ASIC 436 and connection pads 432 may be realized via electrically conductive traces 433 formed on top surface 421 of glass substrate 420, as well as via wire bonds 440. Additional wire bonds 441 may be provided between die 410 and ASIC 436 for enabling operation of the ASIC. While an ASIC is shown, it is contemplated that signal conditioning circuitry may be provided in any suitable form, such as by one or more microprocessors or microcontrollers, as desired. Die 410 may be anodically bonded to glass substrate 420 around a perimeter 415 thereof, forming a hermetic seal therebetween and eliminating the need for any adhesive attachment material.

Figure 5:
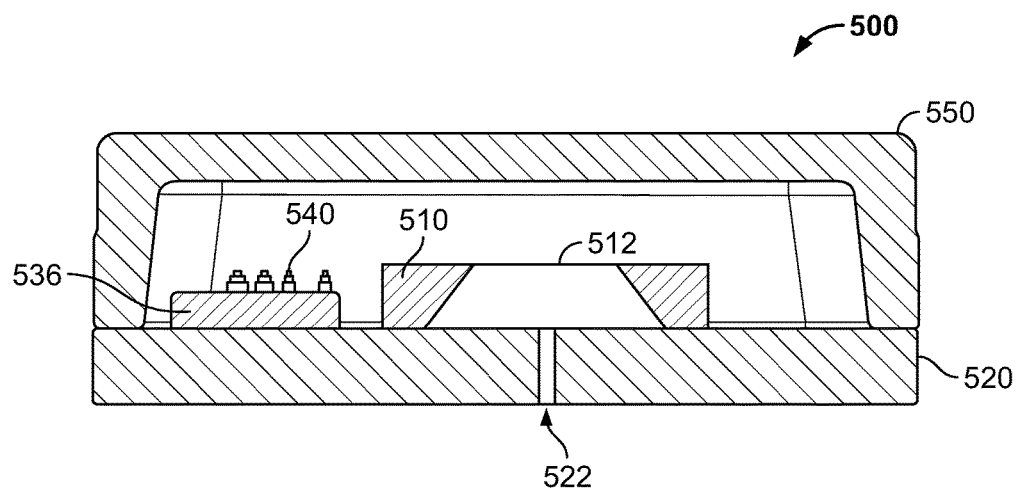
FIG. 5 is a cross-sectional view of a pressure sensor package according to another embodiment of the present disclosure.

FIG. 5 illustrates another pressure sensor assembly or package 500 according to an embodiment of the present disclosure. Package 500 includes features similar to those set forth above with respect to FIGS. 3 and 4, including a glass substrate 520 defining an aperture 522 formed therethrough. A die 510 defining a pressure sensing diaphragm 512 is arranged over aperture 522 and anodically bonded to glass substrate 520 to form a hermetic seal between glass substrate 520 and die 510. An ASIC 536 is also mounted to glass substrate 520. Operational connections between components of package 500 are achieved via, for example, wire bonds 540. Package 500 further includes a protective cover or lid 550 for isolating the components of package 500 from an external environment. Lid 550 may comprise a polymer (e.g. a plastic), metallic or ceramic lid, by way of example only, and may be attached to glass substrate 520 via adhesives or soldering. In other embodiments, lid 550 may comprise a silicon lid anodically bonded to glass substrate 520. In still other embodiments, potting schemes such as a gel fill may replace lid 550 for isolating the components of package 500.

While embodiments of the present disclosure have been described as utilizing, for example, piezo-resistive elements to detect strain of a pressure-sensing diaphragm, it should be understood that any suitable type of sensing technology may be implemented without departing from the scope of the present disclosure. For example, sensors disclosed herein may implement capacitive, electromagnetic, piezoelectric, optical or thermal sensing techniques, as will be understood by one of ordinary skill in the art. Moreover, while the embodiments have generally been described in the context of pressure sensors, it should be understood that other sensor types may be manufactured according to embodiments of the present disclosure. For example, MEMS or other silicon-based devices, such as those used for measuring other forces, flow rates, densities, velocities, positions, displacement and the like may be manufactured using the glass substrate mounting and anodic bonding techniques described herein without departing from the scope of the present disclosure.

Figure 6:
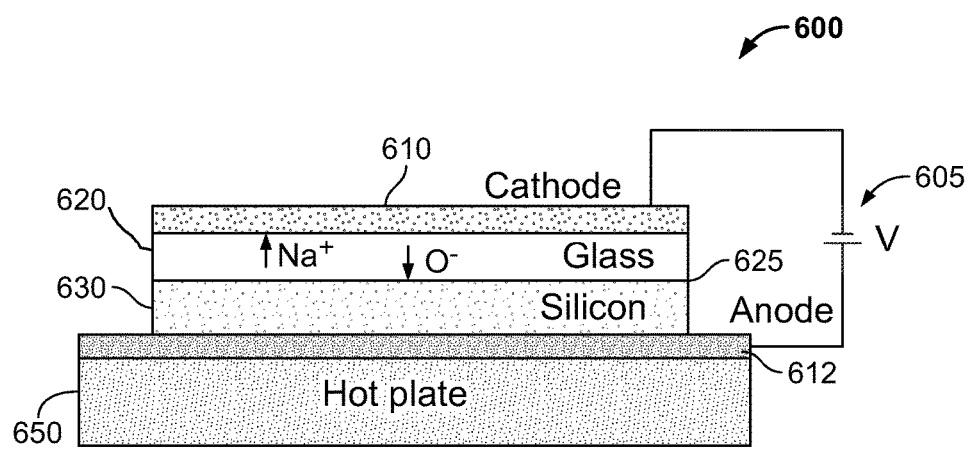
FIG. 6 is a simplified view of a system for performing an anodic bonding process useful for manufacturing sensor packages according to embodiments of the present disclosure.

FIG. 6 illustrates a simplified system for performing an anodic bonding process which may be used to produce the above-described pressure sensor packages according to embodiments of the present disclosure. As shown, a system 600 for forming an anodic bond between a glass substrate 620 to a silicon element 630 (e.g. a MEMS sensing die) includes a voltage source 605 configured to produce, for example, a voltage on the order of, for example, 300-2000 volts (V). Voltage source 605 includes a first (cathode) electrode 610 and a second (anode) electrode 612. First electrode 610 is arranged on, or otherwise placed in contact with, a side of glass substrate 620 opposite silicon element 630. Second electrode 612 is arranged on, or otherwise placed in contact with, a side of silicon element 630 opposite glass substrate 620. The application of voltage across glass substrate 620 and silicon element 620 initiates the anodic bonding process, wherein sodium ions ($Na^+$) diffuse out of bond interface 625 toward a back side of first electrode 610. Oxygen ions ($O^-$) ions drift toward a bonding interface between glass substrate 620 and silicon element 630, reacting therewith to form silicon dioxide, thereby creating a strong bond without the use of conventional adhesives. In some embodiments, it may be preferred to perform the bonding process at elevated temperatures, for example, in the range of 250-450° C. in order to enhance ion mobility into glass substrate 620. System 600 may further include a heating element 650 configured to elevate the temperature of the package to be bonded to a desired level. In some embodiments, heating element 650 may also act as the second or anode electrode 612.

Figure 7:
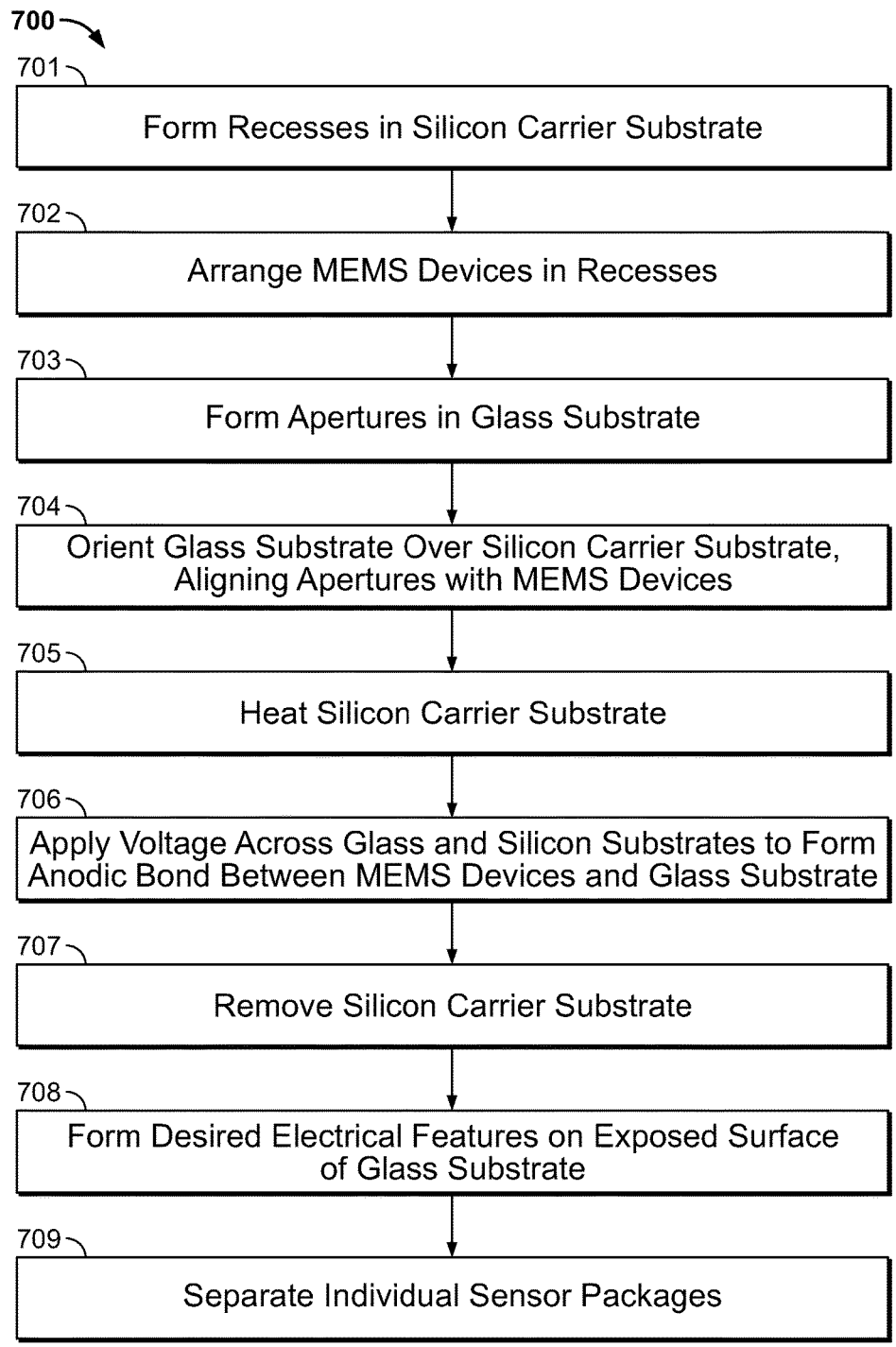
FIG. 7 is a process diagram describing a method of manufacturing a sensor package according to an embodiment of the present disclosure.
Figure 8A:
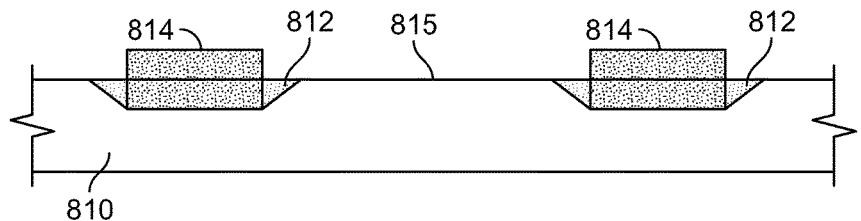
FIGS. 8A, 8B, 8C and 8D are simplified diagrams illustrating steps of a method of manufacturing a sensor package according to an embodiment of the present disclosure.

Methods of manufacturing pressure sensor packages according to embodiments of the present disclosure include the use of bulk manufacturing techniques and are shown with respect to FIGS. 7 and 8A-8D. Referring generally to FIG. 7, a method 700 for manufacturing a plurality of pressure sensor packages according to an embodiment of the present disclosure includes the step of forming 701 a plurality of recesses in a silicon carrier substrate. A pressure sensing device (e.g. a MEMS die) is arranged or placed 702 into each recess such that an operating side of a sensing diaphragm thereof is oriented away from the silicon substrate. FIG. 8A illustrates an exemplary silicon carrier substrate 810 having a plurality of recesses 812 formed in a first side 815 thereof. A corresponding pressure sensing device 814 is placed within each recess 812. In alternative embodiments, recesses may be formed in a glass substrate for receiving the devices.

Figure 8B:
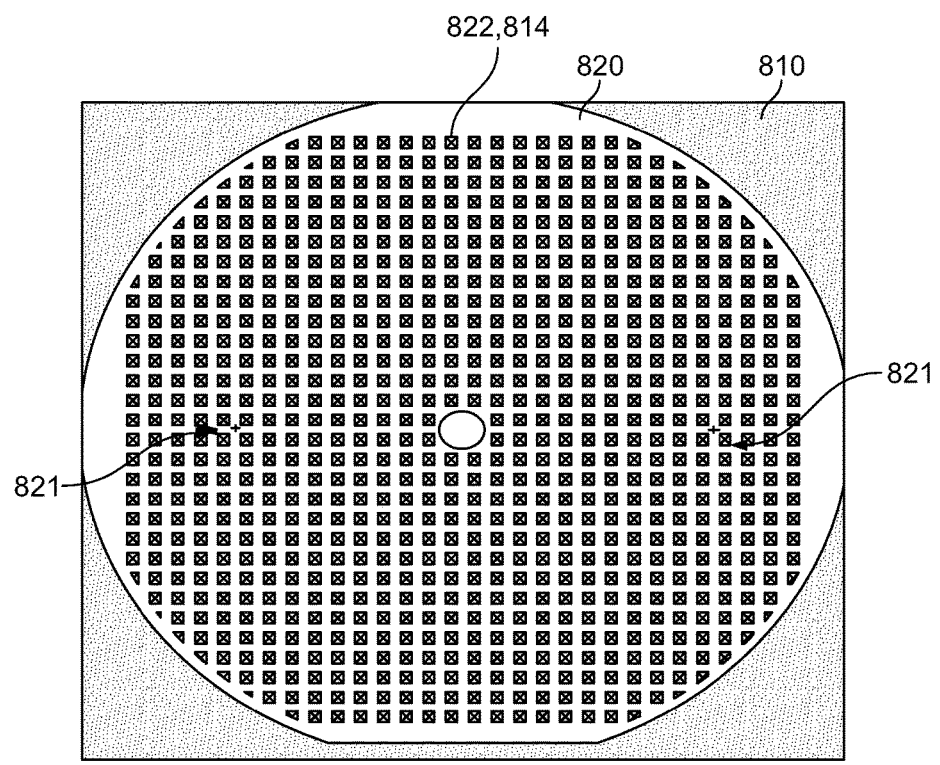
Figure 8C:
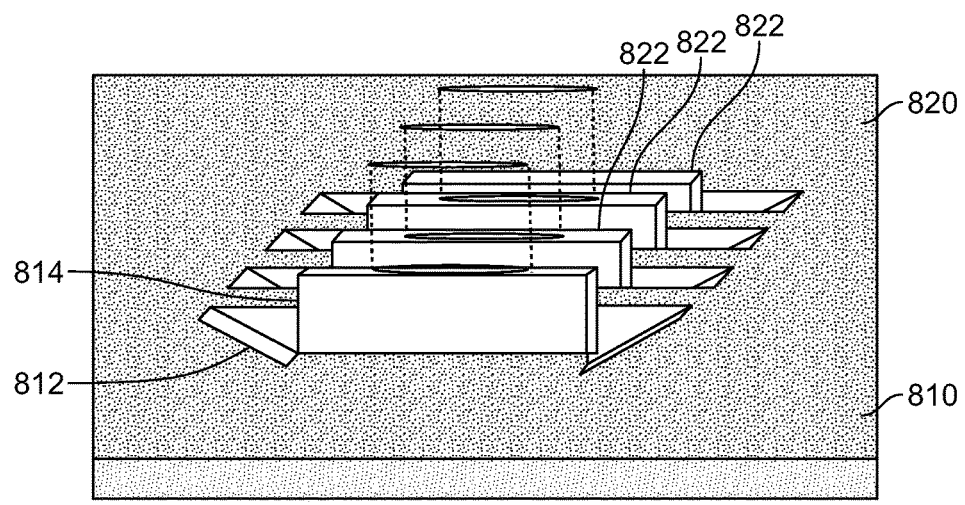

Referring again to FIG. 7, a glass substrate or wafer is provided having a plurality of apertures formed 703 (e.g. drilled) therethrough. The glass wafer is oriented or placed 704 over the silicon carrier substrate and aligned such that the plurality of apertures formed therethrough are aligned with corresponding pressure sensing diaphragms of the pressure sensing dies. FIGS. 8B and 8C illustrate a glass substrate or wafer 820 including a plurality of apertures 822 formed therethrough. Apertures 822 are arranged over and aligned with pressure sensing devices 814 arranged in recesses 812 of silicon carrier substrate 810. Alignment of glass substrate 820 and silicon carrier substrate 810 (and thus pressure sensing devices 814) may be aided by a plurality of alignment marks 821 formed on each of glass substrate 820 and silicon carrier substrate 810 which may be aligned with one another via optical equipment. In embodiments, silicon carrier substrate 810 may be temporarily fixed in position relative glass substrate 820 by, for example, an adhesive and/or a mechanical insert arranged therebetween.

Figure 8D:
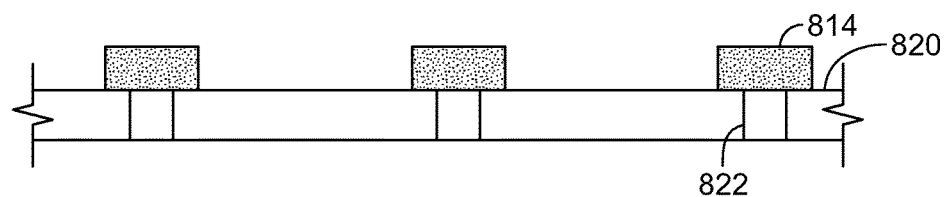

Once aligned, the silicon carrier substrate and glass substrate may be heated 705 with a heating element. A voltage is applied 706 across the glass substrate and silicon carrier substrate to form anodic bonds between the glass substrate and the pressure sensing devices, as described above with respect to FIG. 6. FIG. 8D illustrates pressure sensing devices 814 bonded to glass substrate 820 such that apertures 822 are aligned with a pressure sensing diaphragm thereof (see FIG. 1). It should be noted that the pressure sensing devices have respective bonding surfaces which are raised (e.g. 100-200 um) above a surface of the silicon carrier in order to avoid bonding of the silicon carrier substrate with the glass substrate. Moreover, the use of a silicon carrier substrate aids in maintaining alignment between pressure sensing devices 814 and glass substrate 820 due to the low CTE mismatch. After the bonding process, the silicon carrier substrate is then removed 707 from the glass substrate. If desired, conductive features are the formed 708 on the glass substrate, and electrical connections between the pressure sensing devices and these features may be completed. Individual pressure sensor packages may be separated 709 from the bonded substrates (e.g. via an etching or other cutting process). This singulation from the glass substrate may occur before or after completion of other assembly operations, such as the attachment of an ASIC and/or wire bonding, encapsulation and/or testing and calibration.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A method of manufacturing a sensor comprising the steps of:
   arranging a silicon sensing device on a glass substrate;
   applying a voltage across the sensing device and the glass substrate for anodically bonding the sensing device to the glass substrate; and
   placing an application-specific integrated circuit (ASIC) on the glass substrate.

2. The method of claim 1, wherein the sensing device comprises a Micro-Electro-Mechanical System (MEMS) die.

3. The method of claim 1, wherein the sensing device comprises a pressure sensing device.

4. The method of claim 1, further comprising the step of electrically connecting the sensing device to a conductive element arranged on the glass substrate.

5. The method of claim 1, wherein the step of arranging the sensing device on the glass substrate comprises aligning the sensing device with an aperture formed on the glass substrate.

6. The method of claim 5, further comprising the steps of:
   arranging a plurality of silicon sensing devices in a plurality of recesses formed in a silicon carrier; and
   forming a plurality of apertures through a glass substrate, wherein the step of aligning a sensing device with an aperture of the glass substrate includes aligning the silicon carrier and the glass substrate such that each of the plurality of sensing devices is aligned with a respective one of the plurality of apertures of the glass substrate.

7. The method of claim 6, further comprising the step of applying heat to the silicon carrier.

8. The method of claim 1, further comprising the step of forming a conductive trace on a surface of the glass substrate.

9. The method of claim 8, further comprising the step of forming a bond pad on the glass substrate.

10. The method of claim 8, further comprising the step of electronically connecting the ASIC to at least one of the conductive trace and the sensing device.

11. A method of manufacturing a plurality of sensors comprising the steps of:
    arranging a plurality of silicon pressure sensing devices in a plurality of recesses in a silicon carrier;
    forming a plurality of apertures through a glass substrate;
    aligning the silicon carrier and the glass substrate such that each of the plurality of pressure sensing devices is aligned with a respective one of the plurality of apertures of the glass substrate;
    applying a voltage across the pressure sensing devices and the glass substrate for anodically bonding the pressure sensing devices to the glass substrate; and
    separating each of the plurality of pressure sensing devices and an associated portion of the glass substrate from one another so as to form a plurality of discrete pressure sensor packages.

12. The method of claim 11, wherein the pressure sensing devices comprise Micro-Electro-Mechanical System (MEMS) dies.

13. The method of claim 11, further comprising the step of electrically connecting the pressure sensing devices to conductive elements arranged on the glass substrate.

14. The method of claim 11, further comprising the step of applying heat to the silicon carrier.

15. The method of claim 11, further comprising the steps of:
    forming a plurality of conductive traces on a surface of the glass substrate;
    forming a plurality of bond pads on the glass substrate; and
    placing a plurality of application-specific integrated circuits (ASICs) on the glass substrate.

16. The method of claim 15, further comprising the step of electronically connecting each of the plurality of ASICs to at least one of the plurality of conductive traces and the plurality of pressure sensing devices.

17. A method of manufacturing a sensor comprising the steps of:
    forming a conductive trace on a surface of a glass substrate;
    forming a bond pad on the glass substrate;
    placing an application-specific integrated circuit (ASIC) on the glass substrate;

arranging a silicon sensing device on the glass substrate; and applying a voltage across the sensing device and the glass substrate for anodically bonding the sensing device to the glass substrate.

18. The method of claim 17, further comprising the step of electronically connecting the AS IC to at least one of the conductive trace and the sensing device.

19. The method of claim 17, wherein the sensing device comprises a pressure sensing device.

20. The method of claim 19, wherein the pressure sensing device comprises a Micro-Electro-Mechanical System (MEMS) die.

* * * * *